US 6,606,359 B1

(12) United States Patent
Nag et al.

(10) Patent No.: US 6,606,359 B1
(45) Date of Patent: Aug. 12, 2003

(54) AREA-OPTIMUM RAPID ACQUISITION CELLULAR MULTI-PROTOCOL DIGITAL DC OFFSET CORRECTION SCHEME

(75) Inventors: Manbir Nag, Coral Springs, FL (US); James Mittel, Lake Worth, FL (US)

(73) Assignee: Motorola, INC, Schaumburg, IL (US)

( * ) Notice: Subject to any disclaimer, the term of this patent is extended or adjusted under 35 U.S.C. 154(b) by 444 days.

(21) Appl. No.: 09/626,466

(22) Filed: Jul. 26, 2000

(51) Int. Cl.[7] .................... H04L 25/08; H04L 1/00; H04L 25/06; H03K 5/01; H04B 1/10
(52) U.S. Cl. ................ 375/348; 375/319; 455/296
(58) Field of Search ................ 375/348, 319; 455/296

(56) References Cited

U.S. PATENT DOCUMENTS

| | | | | | |
|---|---|---|---|---|---|
| 4,250,458 A | * | 2/1981 | Richmond et al. | ........... | 329/306 |
| 5,375,146 A | * | 12/1994 | Chalmers | .................. | 375/350 |
| 5,617,060 A | * | 4/1997 | Wilson et al. | ............. | 330/129 |
| 5,696,559 A | * | 12/1997 | Kim | ........................... | 348/691 |
| 5,953,643 A | | 9/1999 | Speake et al. | | |
| 5,986,598 A | * | 11/1999 | Mittel | ....................... | 341/143 |
| 6,002,352 A | * | 12/1999 | El-Ghoroury et al. | ...... | 341/139 |
| 6,009,126 A | * | 12/1999 | Van Bezooijen | ............ | 375/319 |
| 6,081,558 A | | 6/2000 | North | | |
| 6,204,787 B1 | * | 3/2001 | Baird | ........................ | 341/139 |
| 6,275,540 B1 | * | 8/2001 | Barrett, Jr. et al. | ......... | 375/316 |
| 6,307,896 B1 | * | 10/2001 | Gumm et al. | ................ | 375/316 |
| 6,459,889 B1 | * | 10/2002 | Ruelke | ....................... | 455/296 |
| 6,466,832 B1 | * | 10/2002 | Zuqert et al. | ................. | 700/94 |
| 6,498,929 B1 | * | 12/2002 | Tsurumi et al. | ............. | 455/296 |

* cited by examiner

Primary Examiner—Mohammad H. Ghayour
Assistant Examiner—Tony Al-Beshrawi
(74) Attorney, Agent, or Firm—Randi L. Dulaney

(57) ABSTRACT

A digital DC offset correction circuit (68) provides DC offset correction within a receiver (50) using an area-optimum, rapid acquisition cellular multi-protocol digital dc offset correction scheme. The digital DC offset correction circuit (68) includes an integrator (90), a low pass filter (92), a decimator (94), a digital to analog converter codeword clamp (96), and a digital to analog converter (98).

9 Claims, 5 Drawing Sheets

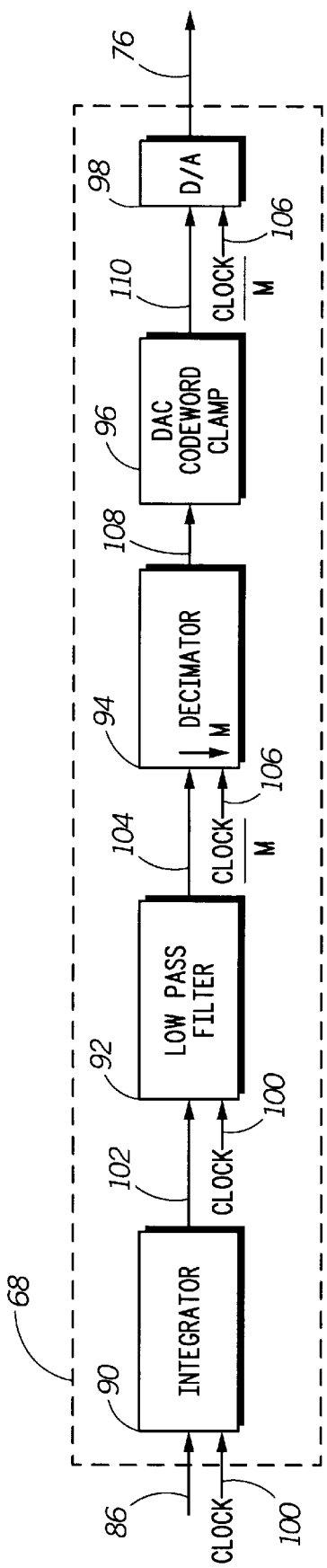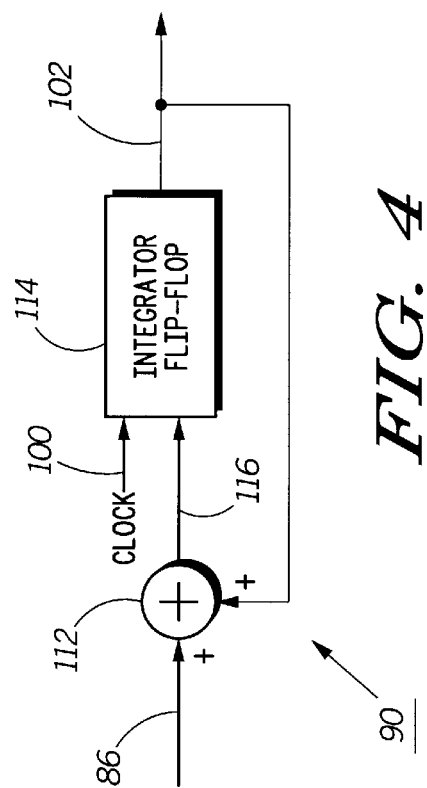
FIG. 3
FIG. 4

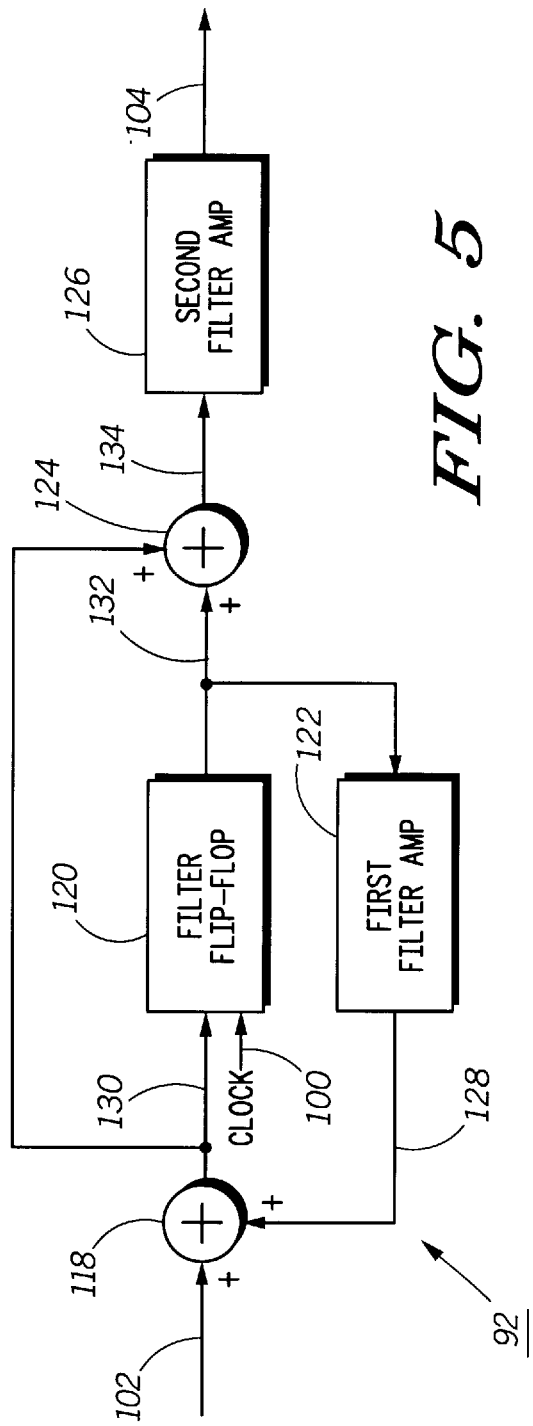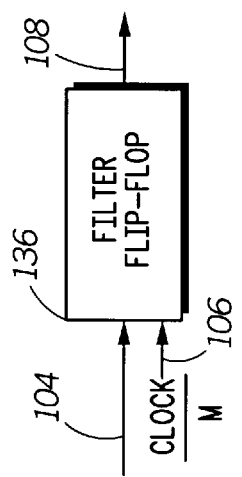

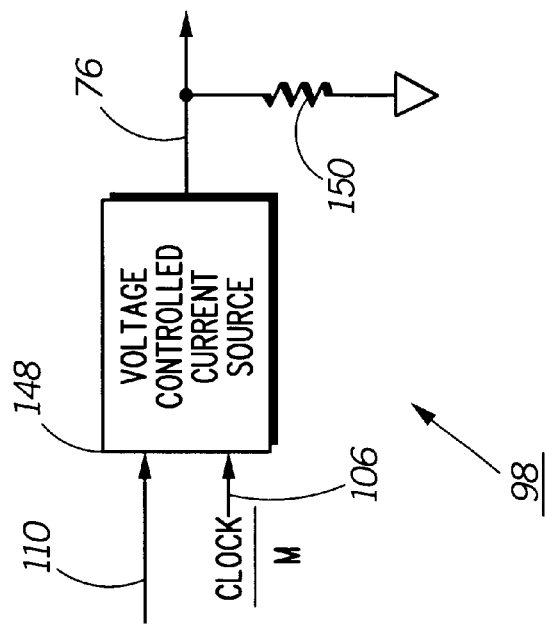
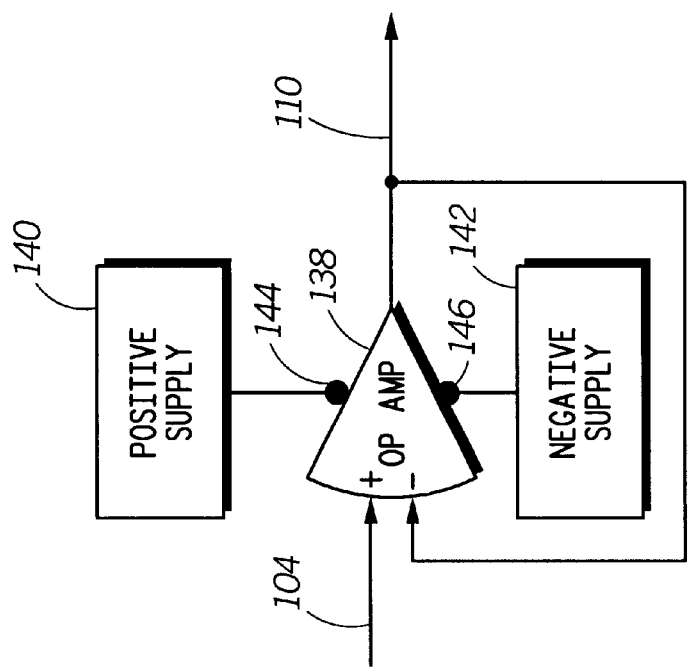
FIG. 8
FIG. 7

AREA-OPTIMUM RAPID ACQUISITION CELLULAR MULTI-PROTOCOL DIGITAL DC OFFSET CORRECTION SCHEME

BACKGROUND OF THE INVENTION

1. Field of the Invention

This invention relates in general to electronic circuits and in particular to DC offset correction circuits.

2. Description of the Related Art

Product designers today are being challenged to continuously create smaller and yet more sophisticated and more powerful electronic communication devices. To achieve this smaller size and more powerful performance, direct conversion and very low intermediate frequency (VLIF) receiver circuits are frequently used radio architectures.

The forward gain path for a direct conversion or very low intermediate frequency receiver has substantial power and/or voltage gain. The amplifiers in the forward gain path have some static or direct current (DC) offset from their respective differential input stages, current mirrors, etc. that are amplified at the their output stage. This DC offset manifests itself as a progressively degraded signal dynamic range in the forward gain path from the radio frequency (RF) fronted to the demodulator backend. Thus a DC offset correction scheme is required to ensure that the optimum signal dynamic range of each of the blocks within the forward gain path is maintained. Failure to do so will result in one or more of the forward gain blocks to clip the incoming signal thereby generating severe amounts of in-band harmonic distortion.

The DC offset correction loop is viewed as an essential requirement in direct-conversion receivers. Traditionally, a continuous time (C.T.) analog DC offset correction loop has been employed. A conventional receiver 10 utilized in radio communication systems and employing a C.T. analog DC offset correction loop is illustrated in FIG. 1. The conventional receiver 10 includes an antenna 12, a preselector 13, a radio frequency (RF) amplifier 14, a radio frequency (RF) mixer 16, an intermediate frequency (IF) filter 18, an intermediate frequency (IF) amplifier 20, an intermediate frequency (IF) mixer 22, a low pass filter 24, and an analog DC offset circuit 26.

The conventional receiver 10 receives a radio frequency (RF) signal 28 sent from a radio communication system 30 that is in a digital format or an analog format using the antenna 12. The preselector 13 filters the received RF signal 28 and passes it to the RF amplifier 14. The RF amplifier 14 then amplifies the radio frequency (RF) signal 28 and passes an amplified RF signal 32. The RF mixer 16 is coupled to a local oscillator 36 so as to produce an intermediate frequency (IF) signal 34 which can be, for example, a very low IF signal or a Zero-IF signal. The frequency of the IF signal 34 is the separation in frequency between the radio frequency signal and the local oscillator signals. The filter 18 generates a filtered IF signal 38 as well as removes spurious components of the IF signal 34 to improve the selectivity of the receiver and reduces the adjacent channel interference.

The intermediate frequency (IF) amplifier 20, which is coupled to the filter 18, is used to amplify the filtered IF signal 38 thereby generating an amplified IF signal 40. The IF mixer 22 then mixes the amplified IF signal 40 down to base band using a reference frequency 42 to produce a baseband signal 44. The IF filter 24 filters the baseband signal 44 to generate an output signal 46. The output signal 46 is passed to the backend 48 for further processing, such as demodulation. The analog DC offset circuit 26 is coupled between the backend 48 and the IF mixer 22 for analog correction of the output signal 46.

With an analog approach such as the conventional receiver of FIG. 1, the offsets are corrected quickly in wide bandwidth mode but the analog correction circuitry must be very precise itself. If the correction system is driven into a non-linear state because the offsets exceed the correction range or because there is excessive base band gain, the correction will be slew rate limited and may not meet the required correction cycle time of the loop. Further, loop analysis shows that such a C.T. analog DC offset loop creates a high-pass response in the forward gain path, wherein the high-pass corner is in the tens to hundreds of Hertz range. It has the tendency to track the incoming signal (not desired) if the bandwidth of the correction loop is made too large, for example greater than 30 Hertz (Hz) in frequency modulation (FM) voice applications. Yet if it is eliminated there will be a corresponding loss of signal dynamic range and clipping in the forward gain path. For direct conversion receivers this high pass corner creates a "hole" in the desired signal bandwidth, which results in a finite Bit Error Rate (BER) floor. In VLIF receiver applications, the loop correction bandwidth can be made much larger as long as the lower half of the information bandwidth is greater than 0 Hertz, for example, 10 Kilohertz (kHz)–190 kHz in typical VLIF Global System for Mobile Communications (GSM) compatible integrated circuits. The variation in the analog components of the DC offset correction loop, however, create distortions which leak into the forward gain path also resulting in degraded radio performance. These problems in the analog approach have led engineers to consider digital implementations.

What is needed is an area-efficient,.high-gain, high-speed DC offset correction loop for use with both several cellular multiple access schemes (M.A.s) such as GSM and EDGE (Enhanced Data for GSM Evolution), Advanced Mobile Phone Service (AMPS), Narrow-band AMPS (NAMPS), North American Digital Cellular (NADC) or IS-136, and Code Division Multiple Access (CDMA), as well as with multiple receiver architectures such as direct conversion (DCR) and very low IF (VLIF).

BRIEF DESCRIPTION OF THE SEVERAL VIEWS OF THE DRAWINGS

FIG. 3 illustrates a functional block diagram of the digital DC offset correction circuit of FIG. 2 in accordance with the present invention;

FIG. 4 illustrates a schematic diagram of an embodiment of an integrator for use in the digital DC offset correction circuit of FIG. 3 in accordance with the present invention;

FIG. 5 illustrates a schematic diagram of an embodiment of a low pass filter for use in the digital DC offset correction circuit of FIG. 3 in accordance with the present invention;

FIG. 6 illustrates a schematic diagram of an embodiment of a decimator for use in the digital DC offset correction circuit of FIG. 3 in accordance with the present invention;

FIG. 7 illustrates a schematic diagram of an embodiment of a digital to analog converter codeword clamp for use in the digital DC offset correction circuit of FIG. 3 in accordance with the present invention; and FIG. 8 illustrates a schematic diagram of an embodiment of a digital to analog converter for use in the digital DC offset correction circuit of FIG. 3 in accordance with the present invention.

DETAILED DESCRIPTION OF THE INVENTION

Figure 1:
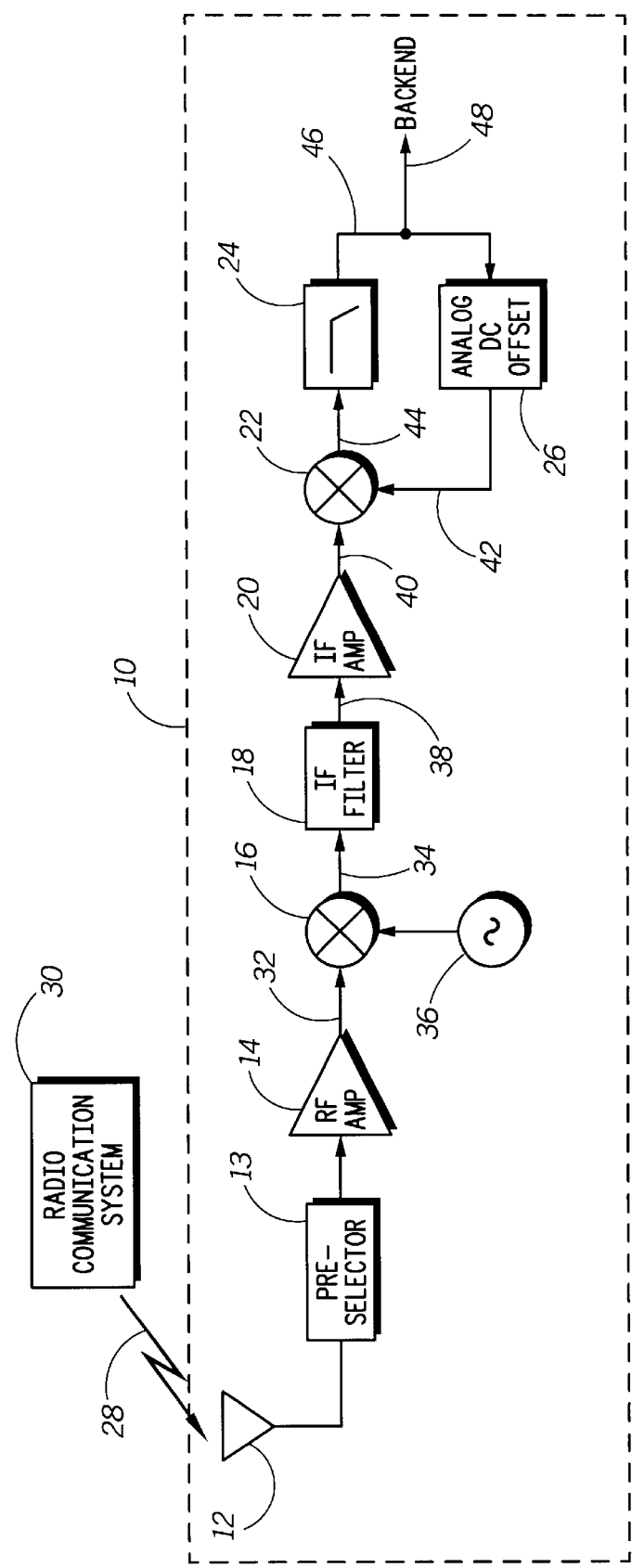
FIG. 1 is a block diagram of a conventional receiver employing an analog DC offset correction loop.
Figure 2:
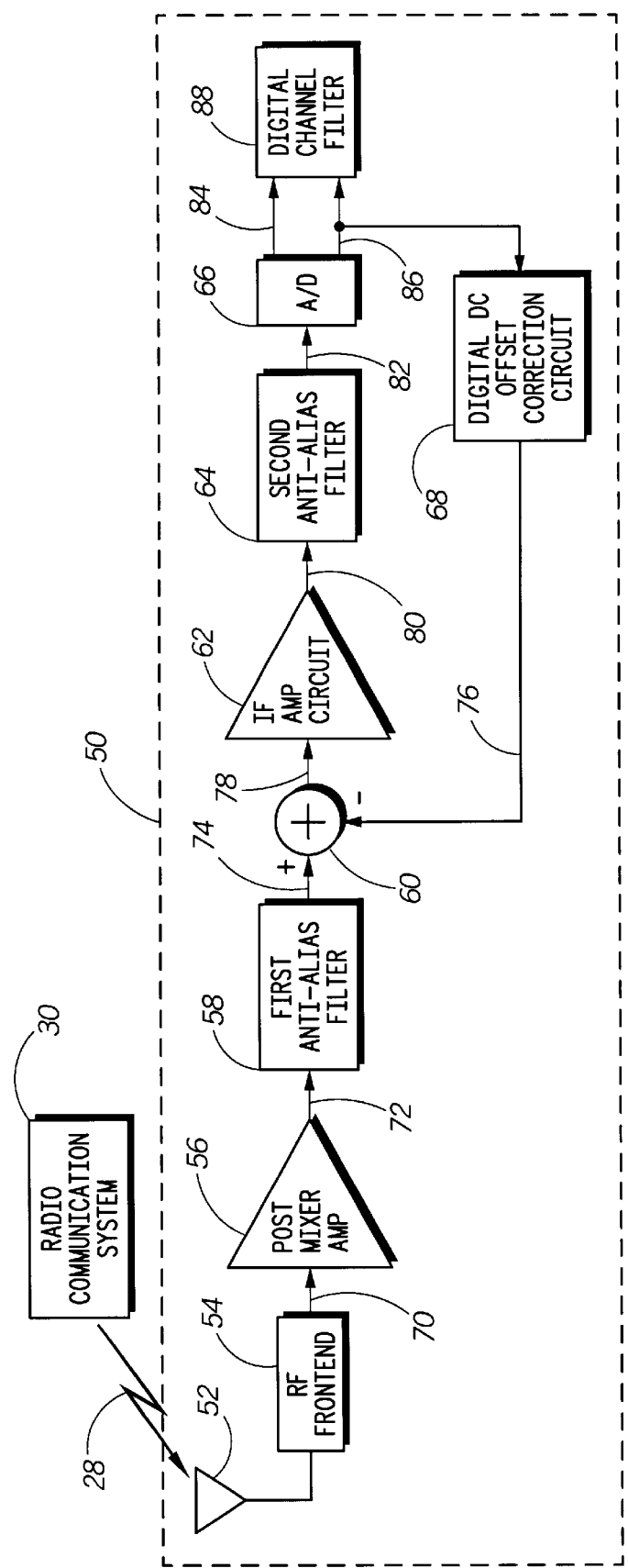
FIG. 2 is a functional block diagram of a receiver employing a digital DC offset correction circuit.

Referring to FIG. 2, a functional block diagram of a receiver 50 operating in accordance with the present invention is illustrated. The receiver 50 includes a receiver antenna 52, a radio frequency (RF) frontend 54, a post mixer amplifier 56, a first anti-alias filter 58, a summing junction 60, an intermediate frequency (IF) amplifier circuit 62, a second anti-alias filter 64, an analog to digital converter 66, and a digital DC offset correction circuit 68.

The receiver 50 receives the radio frequency (RF) signal 28 sent from the radio communication system 30 that is in a digital format or an analog format using the receiver antenna 52. Coupled to the receiver antenna 52 is the RF frontend 54. The RF frontend 54 selects the desired portion within the band of frequencies of the RF signal 28, then amplifies the desired portion, and then down converts it to an IF frequency, thereby generating a desired signal.70. The post mixer amplifier 56 is coupled to the RF frontend 54 and receives the desired signal 70. The post mixer amplifier 56 provides gain to the amplified desired signal 70, thereby generating a post mixer amplifier output 72. The first anti-alias filter 58 is coupled to the post mixer amplifier 56 and receives the post mixer amplifier output 72. The first anti-alias filter 58 is preferably a one-pole filter that provides attenuation to out of band frequencies, thereby generating a first anti-alias filter output 74. The summing junction 60 is coupled to the first anti-alias filter 58 and receives the first anti-alias filter output 74. The summing junction 60 combines the first anti-alias filter output 74 with an offset correction signal 76, thereby generating a combined IF signal 78. The IF amplifier circuit 62 is coupled to the output of the summing junction 60 and receives the combined IF signal 78. The IF amplifier circuit 62 provides programmable IF gain, thereby generating an IF amplifier output 80. The second anti-alias filter 64 is coupled to the output of the IF amplifier circuit 62 and receives the IF amplifier output 80. The second anti-alias filter 64 is preferably a two-pole filter that provides attenuation to the out of band frequencies of the IF amplifier output 80, thereby generating a second anti-alias filter output 82. The analog to digital converter 66 is coupled to the output of the second anti-alias filter 64 and receives the second anti-alias-filter output 82. The analog to digital converter 66 is preferably a multi-bit sigma delta converter. One skilled in the art will recognize that the analog to digital converter 66 can also be any equivalent analog to digital converter. The analog to digital converter 66 converts the second anti-alias filter output 82 from an analog format to a digital format, thereby generating a two bit output including a most significant bit 84 and a least significant bit 86, which are both fed to a digital channel filter 88 of the receiver 50. Preferably, the least significant bit 86 is also fed to the digital DC offset correction circuit 68. The digital DC offset correction circuit 68 calculates the average DC offset and corrects it, thereby generating the offset correction signal 76, which is an input to the summing junction 60.

By using the output of the second order noise-shaping sigma-delta analog to digital converter as the input to the digital DC offset correction circuit 68, the digital DC offset correction circuit 68 acquires the DC offset very rapidly. This yields an order of magnitude better performance than prior art circuits.

The receiver 50 as illustrated in FIG. 2 and described herein provides an electronic circuit for use in radio communication systems including an area efficient, high-gain, high-speed DC offset correction loop. In the present invention, by feeding back the offset correction signal 76 to the IF amplifier circuit 62, extra hardware for gain compensation is not required. Further, the digital DC offset correction circuit gain is independent of the gain of the IF amplifier circuit 62.

FIG. 3 illustrates a functional block diagram of the digital DC offset correction circuit 68 of FIG. 2 in accordance with the present invention. The digital DC offset correction circuit 68 includes an integrator 90, a low pass filter 92, a decimator 94, a digital to analog converter codeword clamp 96, and a digital to analog converter (DAC) 98.

In the digital DC offset correction circuit 68 of FIG. 3, the integrator 90 receives from the analog to digital converter 66 (see FIG. 2) the least significant bit 86 which is preferably a one bit input. The integrator 90 determines an average value of the DC offset of the least significant bit 86 using a clock 100, and also attenuates quantized noise, thereby generating an integrator output 102. The low pass filter 92 is coupled to the integrator 90 and receives the integrator output 102 and also receives the clock 100. The low pass filter 92 preferably is an infinite impulse response (IIR) circuit. Alternatively, the low pass filter 92 is a finite impulse response (FIR) circuit. It will be appreciated by one of ordinary skill in the art that the low pass filter 92, in accordance with the present invention, can function utilizing the above low pass filters or an equivalent. The low pass filter 92 generates a low pass filter output 104 as well as removes spurious components of the integrator output 102, reduces the adjacent channel interference and further attenuates the analog to digital converter quantization noise. The decimator 94 is coupled to the output of the low pass filter 92 and receives the low pass filter output 104 and a divided clock 106. The decimator 94 reduces the clock frequency of the ensuing electronic circuit blocks, thereby generating a decimator output 108. The digital to analog converter codeword clamp 96 is coupled to the output of the decimator 94 and receives the decimator output 108. The digital to analog converter codeword clamp 96 clamps the digital to analog converter codeword of the decimator output 108 to a certain maximum and minimum value so that there is no phase reversal at the input of the digital to analog converter 98, thereby generating a clamped signal 110. The digital to analog converter 98 is coupled to the output of the digital to analog converter codeword clamp 96 and receives the clamped signal 110 and the divided clock 106. The digital to analog converter 98 converts the DC correction value from the digital domain to the analog domain, thereby generating the offset correction signal 76, which is an input to the summing junction 60 as illustrated in FIG. 2.

In a preferred embodiment of the digital DC offset correction circuit 68 of FIG. 3, the signal processing to determine the magnitude and polarity of the DC offset is performed in the digital domain at very high speed and with very high precision. The digital DC offset correction circuit 68 runs for the allocated length of time, depending upon which M.A. the receiver 50 is setup for, before the receiver 50 is put into signavdata receive mode. During this time it acquires the DC offset, which can be written into a memory unit such as a RAM or D flip-flops. It will be appreciated by those skilled in the art that the receiver 50 can function utilizing any memory unit such as the memory units described herein or an equivalent. Thereafter, only the digital to analog converter 98 remains powered on and the acquired DC offset magnitude and polarity can be written to the digital to analog converter 98 to enforce a correction. Preferably, D flip-flops are used, and their value can be made unchangeable by disconnecting their clock inputs once the DC offset has been acquired. This effectively eliminates the high-pass corner associated with a C.T. DC offset correction loop. This is a significant achievement for a direct-conversion receiver, which is very sensitive to the magnitude of the high-pass corner.

The analog to digital converter 66 of FIG. 2, which is preferably a second order noise shaping analog to digital converter, introduces two zeros in the out-of-band spectrum (for example: greater than 200 kHz) which must be counter-balanced by two poles. This is achieved by the one pole of the integrator 90 and by the second pole of the low pass filter 92. Thus, the out-of-band noise of the sigma-delta analog to digital converter 66 is attenuated and does not re-enter the forward gain path. This is one function of the integrator 90 and low pass filter 92. A second function of these circuit blocks is to average the sigma-delta digital output to ascertain the correct polarity and magnitude of the DC offset. As is well known by those skilled in the art, the sigma-delta output is a logic one/logic zero pattern that in itself is not useful. A third function of the integrator 90 is to introduce very high gain at DC, which allows the digital DC offset correction circuit 68 to acquire the DC offset very rapidly.

The present invention implements the DC offset correction loop in a mixed-mode signal environment, wherein the integrator 90, the low pass filter 92, the decimator 94 and the digital to analog converter codeword clamp 96 are implemented in the digital domain; and the digital to analog converter 98 is implemented in the analog domain, thereby achieving a significant silicon area savings as compared to an equivalent C.T. implementation. Further, the present invention as described herein is both more precise and more immune to noise than the C.T. equivalent.

FIG. 4 illustrates a schematic diagram of an embodiment of the integrator 90 for use in the digital DC offset correction circuit 68 of FIG. 3 in accordance with the present invention. As illustrated in FIG. 4, the integrator 90 includes an integrator summing junction 112 and an integrator flip-flop 114. The integrator summing junction 112 combines the least significant bit 86 and the integrator output 102 which is the output of the integrator flip-flop 114, thereby generating an integrator summing junction output 116. The integrator flip-flop 114 is coupled to the integrator summing junction 112 and receives the integrator summing junction output 116 and the clock 100. The integrator flip-flop 114 delays the integrator summing junction output 116 by exactly one clock cycle, thereby generating the integrator output 102. The integrator 90 as illustrated averages the DC offset of the least significant bit 86. The integrator 90 can be modeled in the z-domain wherein the integrator 90 has a transfer function of:

$$H(z) = \frac{z^{-1}}{1 - z^{-1}}$$

FIG. 5 illustrates a schematic diagram of an embodiment of the low pass filter 92 for use in the digital DC offset correction circuit 68 of FIG. 3 in accordance with the present invention. As illustrated in FIG. 5, the low pass filter 92 includes a first filter summing junction 118, a filter flip-flop 120, a first filter amplifier 122, a second filter summing junction 124, and a second filter amplifier 126. The low pass filter 92 preferably is an infinite impulse response circuit.

The infinite impulse response circuit requires a smaller area of silicon when manufactured on an integrated circuit because a lower filter order can be used to achieve the same functionality as compared to other similar low pass filter circuits. The first filter summing junction 118 of the low pass filter 92 combines the integrator output 102 and a first filter amplifier output 128 which is the output of the first filter amplifier 122, thereby generating a first filter summing junction output 130. The filter flip-flop 120 is coupled to the first filter summing junction 118 and receives the first filter amplifier output 128 and the clock 100. The filter flip-flop 120 delays its input signal by exactly one clock cycle, thereby generating a filter flip-flop output 132. The first filter amplifier 122 is coupled to the output of the filter flip-flop 120 and receives the filter flip-flop output 132. The first filter amplifier 122 provides programmable gain, thereby generating the first filter amplifier output 128. The feedback loop formed with the first filter amplifier 122 shifts right (or scales down) the integrator output 102 by a programmable amount that defines the low pass filter 92 corner frequency. The second filter summing junction 124 is coupled to the output of the filter flip-flop 120 and is coupled to the output of the first filter summing junction 118. The second filter summing junction 124 combines the first filter summing junction output 130 and the filter flip-flop output 132, thereby generating a second filter summing junction output 134. The second filter amplifier 126 is coupled to the output of the second filter summing junction 124 and receives the second filter summing junction output 134. The second filter amplifier 126 provides programmable gain, thereby generating the low pass filter output 104.

The low pass filter 92 can be modeled in the z-domain wherein the low pass filter 92 has a transfer function of:

$$H(z) = K \cdot \frac{1 + z^{-1}}{1 + \beta \cdot z^{-1}}$$

Where K and β are defined in terms of their analog components as follows:

$$\beta = \frac{t_s - 2CR}{t_s + 2CR} \quad K = \frac{t_s}{t_s + 2CR}$$

The transfer function described herein is in terms of the inverse of the filter sampling frequency ($t_s = 1/f_s$) and R, C are the values of a resistor and a capacitor that would be used to make an equivalent analog filter.

As an example, simulations indicated that, independent of the IF amplifier circuit 62 gain setting, K=1/256 for the GSM mode, and K=1/512 for the NADC mode in order to ensure a nearly critically damped system.

FIG. 6 illustrates a schematic diagram of an embodiment of the decimator 94 for use in the digital DC offset correction circuit 68 of FIG. 3 in accordance with the present invention. As illustrated in FIG. 6, the decimator 94 includes a decimator flip-flop 136. The decimator flip-flop 136 receives the low pass filter output 104 and the divided clock 106 and delays its input signal by exactly one clock cycle, thereby generating the decimator output 108.

FIG. 7 illustrates a schematic diagram of an embodiment of the model of the digital to analog converter codeword clamp 96 for use in the digital DC offset correction circuit 68 of FIG. 3 in accordance with the present invention. The digital to analog converter codeword clamp 96 includes an operational amplifier 138. The operational amplifier 138 is used in a unity gain/buffer mode, thus the clamped signal 110 faithfully follows the input to the operational amplifier 138, which is the decimator output 108. A positive supply 140 and a negative supply 142 of the operational amplifier 138 are connected to the appropriate value for a positive clamp value 144 and a negative clamp value 146, preferably to a code word of 6-bit length. This clamping of the digital to analog converter codeword ensures that the DC correction requires the minimum required hardware.

FIG. 8 illustrates a schematic diagram of an embodiment of the model of the digital to analog converter 98 for use in the digital DC offset correction circuit 68 of FIG. 3 in accordance with the present invention. The digital to analog converter 98 as illustrated in FIG. 8 includes a voltage controlled current source 148 and a load resistor 150. The voltage controlled current source 148 receives the clamped signal 110 and the divided clock 106 and depending upon its transconductance genberates the appropriate output current for a given input voltage, thereby generating the offset correction signal 76. The load resistor 150 is coupled to the output of the voltage controlled current source 148 and represents the IF amplifier circuit feedback resistor. The IF amplifier gain is automatically gain controlled in the system by altering the value of the load resistor 150.

The number of bits required in the digital to analog converter 98 is a flexible parameter—if a coarse DC correction is required, i.e. a large residue is acceptable, then few digital to analog converter bits are needed. On the other hand, if a fine DC correction is required, i.e. a small residue is required, then more number of digital to analog converter bits are needed.

An analysis of the loop transfer function yields the following equation:

$$\frac{V_{out}(z)}{V_{in}(z)} = \frac{K_{IFA} \cdot \beta \cdot \left(\frac{1}{\beta} + z^{-1}\right) \cdot (1 - z^{-1})}{z^{-2} \cdot (K \cdot g_m \cdot R_2 - \beta) + z^{-1} \cdot (\beta - 1 + K \cdot g_m \cdot R_2) + 1}$$

The loop transfer function confirms that the loop gain is independent of the load resistor 150.

The present invention, as described herein, provides an electronic circuit for the reduction of a DC offset component that, for example, is due to process, temperature, and voltage variation with an insignificant impact on sensitivity.

Although the invention has been described in terms of preferred embodiments, it will be obvious to those skilled in the art that various alterations and modifications may be made without departing from the invention. accordingly, it is intended that all such alterations and modifications be considered as within the spirit and scope of the invention as defined by the appended claims.

What is claimed is:

1. A receiver for receiving and processing a radio frequency signal using an area-optimum rapid acquisition cellular multi-protocol digital dc offset correction scheme within a radio communication system, the receiver comprising:

a receiver antenna for receiving the radio frequency signal;

a radio frequency frontend coupled to the receiver antenna for receiving the radio frequency signal and for generating a desired signal;

a post mixer amplifier coupled to the radio frequency frontend receiving the desired signal and for generating a post mixer amplifier output;

a first anti-alias filter coupled to the post mixer amplifier for generating a first anti-alias filter output;

a summing junction coupled to the first anti-alias filter for receiving the first anti-alias filter output and an offset correction signal and for generating a combined intermediate frequency signal;

an intermediate frequency amplifier circuit coupled to the summing junction for receiving the combined intermediate frequency signal and for generating an intermediate frequency amplifier output;

a second anti-alias filter coupled to the intermediate frequency amplifier circuit receiving the intermediate frequency amplifier output and for generating a second anti-alias filter output;

an analog to digital converter coupled to the second anti-alias filter for receiving the second anti-alias filter output and for generating a most significant bit and a least significant bit; and a digital DC offset correction circuit coupled between the analog to digital converter and the summing junction, for receiving the least significant bit and for generating the offset correction signal.

2. A receiver for receiving and processing a radio frequency signal as recited in claim 1, wherein the analog to digital converter comprises a second order noise-shaping sigma-delta analog to digital converter.

3. A digital DC offset correction circuit for providing DC offset correction within a receiver for receiving and processing a radio frequency signal using an area-optimum, rapid acquisition cellular multi-protocol digital dc offset correction scheme within a radio communication system, the receiver including an analog to digital converter and a clock, the digital DC offset correction circuit comprising:

an integrator, for receiving a least significant bit from the analog to digital converter and for generating an integrator output;

a low pass filter coupled to the integrator for receiving the integrator output and for generating a low pass filter output;

a decimator coupled to the low pass filter for receiving the low pass filter output and for generating a decimator output;

a digital to analog converter codeword clamp coupled to the decimator for receiving the decimator output and for generating a clamped signal; and a digital to analog converter coupled to the digital to analog converter codeword clamp for receiving the clamped signal and for generating an offset correction signal.

4. A digital DC offset correction circuit as recited in claim 3, wherein the integrator comprises:

an integrator summing junction for receiving the least significant bit and the integrator output, wherein the integrator summing junction combines the least significant bit and the integrator output, thereby generating an integrator summing junction output; and an integrator flip-flop coupled to the integrator summing junction for receiving the integrator summing junction output and the clock, wherein the integrator flip-flop delays the integrator summing junction output for one clock cycle, thereby generating the integrator output.

5. A digital DC offset correction circuit as recited in claim 3, wherein the low pass filter comprises:

a first filter summing junction for receiving the integrator output and a first filter amplifier output, wherein the first filter summing junction combines the integrator output and the first filter amplifier output, thereby generating a first filter summing junction output;

a filter flip-flop, coupled to the first filter summing junction, for receiving the first filter summing junction output and for receiving the clock, wherein the filter flip-flop delays the first filter summing junction output by one clock cycle, thereby generating a filter flip-flop output;

a first filter amplifier, coupled between the filter flip-flop and the first filter summing junction, for receiving the filter flip-flop output, wherein the first filter amplifier provides gain to the filter flip-flop output, thereby generating a first filter amplifier output;

a second filter summing junction, coupled to the filter flip-flop and coupled to the first filter summing junction, for receiving the first filter summing junction output and the filter flip-flop output, wherein the second filter summing junction combines the first filter summing junction output and the filter flip-flop output, thereby generating a second filter summing junction output; and a second filter amplifier, coupled to the second filter summing junction, for receiving the second filter summing junction output, wherein the second filter amplifier provides gain to the second filter summing junction output, thereby generating the low pass filter output.

6. A digital DC offset correction circuit as recited in claim 3, wherein the low pass filter comprises an infinite impulse response circuit.

7. A digital DC offset correction circuit as recited in claim 3, wherein the decimator comprises:

a decimator flip-flop, wherein the decimator flip-flop receives the low pass filter output and the clock and further wherein the decimator flip-flop delays the low pass filter output by one clock cycle, thereby generating the decimator output.

8. A digital DC offset correction circuit as recited in claim 3, wherein the digital to analog converter codeword clamp comprises:

an operational amplifier, wherein the operational amplifier functions in a unity gain mode.

9. A digital DC offset correction circuit as recited in claim 3, wherein the digital to analog converter comprises:

a voltage controlled current source for receiving the clamped signal and the clock and for generating the offset correction signal; and a load resistor coupled to the output of the voltage controlled current source.

* * * * *